United States Patent [19]
Wohrstein et al.

[11] Patent Number: 5,604,668
[45] Date of Patent: Feb. 18, 1997

[54] APPARATUS FOR SHIELDING ELECTRONIC CIRCUIT BOARDS

[75] Inventors: Katharine M. Wohrstein, Mount Prospect; Vito A. Copertino, Carol Stream, both of Ill.

[73] Assignee: Motorola, Inc., Schaumburg, Ill.

[21] Appl. No.: 568,213

[22] Filed: Dec. 6, 1995

[51] Int. Cl.$^6$ .................................................. H05K 9/00
[52] U.S. Cl. ........................ 361/816; 361/796; 361/800; 174/35 R
[58] Field of Search ................................ 361/752, 796, 361/799, 800, 816, 818; 174/35 R; 257/659, 660; 439/108, 109

[56] References Cited

U.S. PATENT DOCUMENTS

| | | | |
|---|---|---|---|
| 5,329,422 | 7/1994 | Sasaki | 361/686 |
| 5,347,430 | 9/1994 | Curlee et al. | 361/816 |
| 5,430,617 | 7/1995 | Hsu | 361/818 |

OTHER PUBLICATIONS

"Low Pass EMI Filters", (date Unknown), Spectrum Control Inc.

*Primary Examiner*—Leo P. Picard
*Assistant Examiner*—Y. Whang
*Attorney, Agent, or Firm*—Jeffrey G. Toler

[57] ABSTRACT

An apparatus (10) for shielding electronic circuit boards (14, 15) including a compartment assembly (16) having a wall (18) defining first (22) and second compartments (24), an electrical connection layer (26) having a first ground layer (44) in electrical contact with the wall (18) of the compartment assembly (16), and a cover (28) connected to the electrical connection layer (26). The wall (18) has a first surface (20) and a second surface (25) substantially perpendicular to the first surface (20). The electrical connection layer (26) has a non-ceramic insulating layer (46) connected to the ground layer (44) and a conductive layer (40) connected to the non-ceramic insulating layer (46).

17 Claims, 2 Drawing Sheets

5,604,668

APPARATUS FOR SHIELDING ELECTRONIC CIRCUIT BOARDS

FIELD OF THE INVENTION

The present invention is generally related to electronic circuits and more particularly is related to shielding electromagnetic interference from electronic circuits.

BACKGROUND OF THE INVENTION

Electronic circuits emit electro-magnetic interference that must be shielded to comply with applicable Federal Communication Commission (FCC) guidelines. A conventional method of reducing electro-magnetic emissions is to use cable assemblies and filter feed thru plates to electrically isolate different circuit boards. The filter feedthru devices reduce emissions by filtering signals to be passed between circuit boards that are typically in separate compartments. However, filter feedthru plates generally require a large amount of cable routing space and are typically cumbersome, expensive, and time consuming to build.

Accordingly, there is a need for a less expensive apparatus with reduced space requirements for shielding electronic circuit boards.

SUMMARY OF THE INVENTION

In order to address this need, the present invention provides an apparatus for shielding electronic circuit boards. The apparatus comprises a compartment assembly including a wall defining first and second compartments, an electrical connection layer having a first ground layer in electrical contact with the wall of the compartment assembly, and a cover connected to the electrical connection layer. The wall has a first surface and a second surface substantially perpendicular to the first surface. The electrical connection layer has a non-ceramic insulating layer connected to the first ground layer and a conductive layer connected to the non-ceramic insulating layer. The conductive layer electrically couples a first circuit board in the first compartment and a second circuit board in the second compartment. The electrical connection layer is substantially parallel to the second surface of the wall and substantially parallel to the cover over a region where the ground layer is in electrical contact with the wall.

The invention itself, together with its intended advantages will best be understood by reference to the following detailed description, taken in conjunction with the accompanying drawings.

DETAILED DESCRIPTION OF THE PREFERRED EMBODIMENTS

Figure 1:
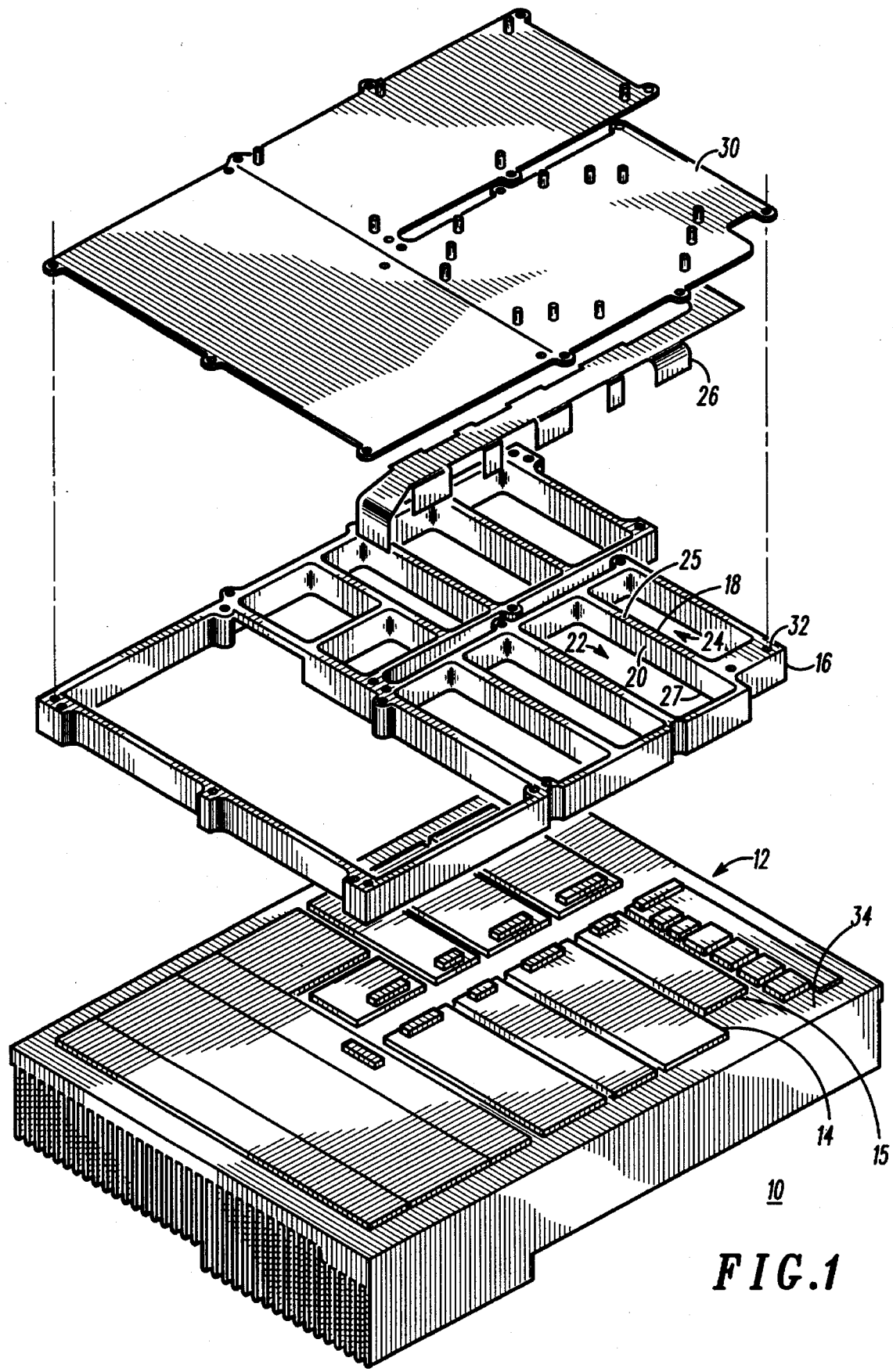
FIG. 1 is an exploded perspective view of an apparatus according to a preferred embodiment of the present invention.

FIG. 1 illustrates a preferred embodiment of an apparatus 10 for shielding electronic circuit boards. The apparatus 10 for shielding electronic circuit boards includes a compartment assembly 16, an electrical connection layer 26, and a cover 30. The compartment assembly 16 includes a wall 18 defining a first compartment 22 and a second compartment 24. The wall 18 has a first surface 20 and a second surface 25. Preferably, the first surface 20 is a side wall and the second surface 25 is a top portion. The compartment assembly 16 is made from an electrically conductive material, preferably aluminum, and may have a gasket on its bottom side. The wall 18 also has a bottom portion 27. The compartment assembly 16 is placed on an circuit board mounting surface 12, such as heat sink or a PC board surface, made from an electronically conductive material, preferably aluminum, including electronic circuit boards 14 and 15 mounted thereon. In the preferred embodiment a first circuit board 14 fits within the first compartment 22 and a second circuit board 15 fits within the second compartment 24 of the compartment assembly 16. The first and second circuit boards 14, 15 are spaced apart so that the wall 18 separates the first and second circuit boards 14, 15 when the compartment assembly 16 is placed on the board mounting surface 12. Since the compartment assembly 16 is made from an electrically conductive material the wall 18 electrically isolates the first circuit board 14 from the second circuit board 15.

The electrical connection layer 26 electrically couples the first circuit board 14 within the first compartment 22 and the second circuit board 15 within the second compartment 24. The electrical connection layer 26 is preferably placed on top of the compartment assembly 16 although the electrical connection layer may alternatively be placed between the mounting surface 12 and the bottom portion 27 of the wall 18. More specifically, the electrical connection layer 26 has a bottom surface in contact with the second surface 25 of the wall 18. The electrical connection layer 26 is disposed over the compartment assembly 16 such that the electrical connection layer is substantially parallel to the second surface 25 of the wall 18 over a region where the electrical connection layer 26 is in contact with the wall 18.

The cover 30 includes a gasket layer that is connected to the electrical connection layer 26 when the cover 30 is placed on the electrical connection layer 26 which in turn is placed on the compartment assembly 16. The cover 30 is substantially parallel to the region of the electrical connection layer 26 in contact with the second surface 25.

In the preferred embodiment the electrical connection layer 26 is a multi-layer flex circuit. The multi-layer flex circuit 26 has extending portions that may be connected to the first and second electric circuit boards 14, 15. Thus the electrical connection layer 26 allows the first and second electric circuit boards 14, 15 to communicate with each other. In addition, the placement of the compartment assembly wall 18 between the first and second circuit boards 14, 15 and the arrangement of the electrical connection layer 26 between the top wall 25 and the cover 30 substantially reduces electromagnetic emissions from the electrical connection layer 26. Thus, the apparatus 10 shields the electronic circuit boards 14, 15 while allowing electrical coupling between compartments 22 and 24 of the compartment assembly 16. In order to properly align the compartment assembly 16, the electrical connection layer 26, the mounting board layer 12, and the cover 30, screw holes 28, 32, and 34 are provided such that an appropriately sized screw or other fastener may be inserted therein to maintain proper alignment and to secure the entire multi-layer apparatus 10.

Figure 2:
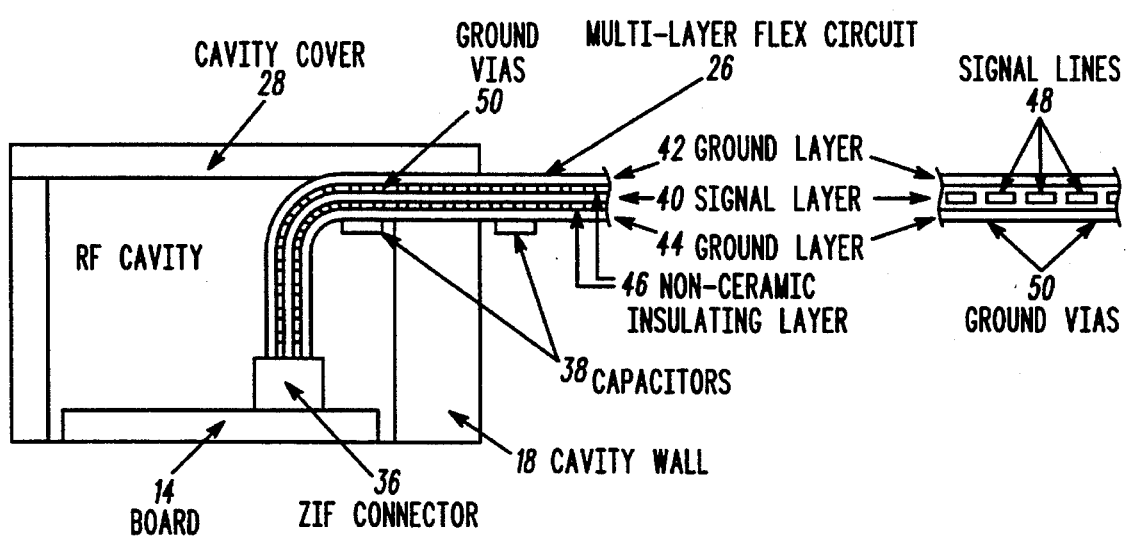
FIG. 2 is a side view of the apparatus of FIG. 1.

FIG. 2 illustrates a side view of the shielding apparatus 10. The apparatus 10 includes the first circuit board 14, the electrical connection layer 26, the cover 30, and the cavity wall 18. The apparatus 10 also includes a connector 36 coupling the first circuit board 14 and the electrical connection layer 26. The electrical connection layer 26 is preferably a multi-layer flex circuit having a first ground layer 44, a second ground layer 42, a conductive layer 40, having a plurality of signal lines 48 and a nonceramic insulating layer 46 separating the conductive layer 40 and the first ground layer 44. A substantially similar nonceramic insulating layer 46 also separates the conductive layer 40 from the second ground layer 42. Preferably, capacitors 38 connect each signal line 48 in the conductive layer 40 to the ground layer 44 on opposite sides of the cavity wall 18. The capacitors 38 are placed adjacent the cavity wall, but preferably do not come in contact with the cavity wall 18. The capacitors 38 provide a filtering function to improve electrical isolation between the compartments 22, 24 within the assembly 16.

In the preferred embodiment, the conductive layer 40 includes a plurality of signal lines 48 separated from each other by the insulating layer 46. Also, ground vias 50 connect the first ground layer 44 and the second ground layer 42 along the perimeter of the electrical connection layer 26.

In the preferred embodiment, the insulating layer 46 is made from a polyimide or kapton material, and the conductive layer 40 is made from an electrically conductive material such as copper. The ground layers 42, 44 are also preferably made from an electrically conductive material such as copper. The multi-layer flex circuit 26 is preferably a suitable multi-layer flex circuit such as that available from Sheldahl, Company of Northfield, Minn. 55057. The electrical connection layer 26 is preferably a substantially planer connector with a thickness of about 0.2 millimeters. Also, in the preferred embodiment the cover 30 includes a layer of aluminum foil and a layer of rubber material with the foil side in contact with the wall top. The cover 30 is made of electrically conductive material, preferably aluminum.

The preferred embodiment described above has many benefits. One of these benefits is reduced cost and complexity due to elimination of the filter feedthru devices used by conventional shielding apparatus. Also, since the electrical connection layer 26 is flexible, less space is required. In addition, the amount of time for assembly is reduced since connections between the electrical connection layer 26 and the circuit board 14 are implemented via a simple connector 36.

Further advantages and modifications of the above described apparatus and method will readily occur to those skilled in the art. The invention, in its broader aspects, is therefore not limited to the specific details, representative apparatus, and illustrative examples shown and described above. Various modifications and variations can be made to the above specification without departing from the scope or spirit of the present invention, and it is intended that the present invention cover all such modifications and variations provided they come within the scope of the following claims and their equivalents.

What is claimed is:

1. An apparatus for shielding electronic circuit boards, the apparatus comprising:

a compartment assembly including a wall defining first and second compartments, said wall having a first surface and a second surface substantially perpendicular to the first surface;

an electrical connection layer having a first ground layer in electrical contact with the wall of the compartment assembly, a non-ceramic insulating layer connected to the first ground layer, and a conductive layer connected to the non-ceramic insulating layer, said conductive layer electrically coupling a first circuit board in the first compartment and a second circuit board in the second compartment; and a cover connected to the electrical connection layer;

said electrical connection layer substantially parallel to the second surface and substantially parallel to the cover over a region where the ground layer is in electrical contact with the wall.

2. The apparatus of claim 1, wherein said non-ceramic insulating layer comprises one of polyimide and kapton.

3. The apparatus of claim 1, wherein said cover includes a gasket layer comprising a conductive layer and a rubber layer connected to the conductive layer.

4. The apparatus of claim 1, wherein said compartment assembly is made from a conductive material.

5. The apparatus of claim 4, wherein said conductive material is aluminum.

6. The apparatus of claim 1, wherein said first wall comprises a side wall and said second wall comprises a top wall in contact with said cover.

7. The apparatus of claim 6, wherein said wall further comprises a third surface opposite from the first surface and perpendicular to the second surface.

8. The apparatus of claim 7, wherein said region comprises an area having a length defined by a distance between the first and third surfaces of the wall and a width determined by the width of the electrical connection layer.

9. The apparatus of claim 1, wherein said first wall comprises a side wall and said second wall comprises a bottom wall.

10. The apparatus of claim 1, further comprising a filtering circuit connected to the conductive layer of the electrical connecting layer.

11. The apparatus of claim 10, wherein said filtering circuit comprises a capacitor.

12. The apparatus of claim 10, wherein said filtering circuit is adjacent said first surface.

13. The apparatus of claim 1, where said electrical connection layer further comprises a second non-ceramic insulating layer connected to the conductive layer, and a second ground layer connected to the second non-ceramic insulating layer.

14. The apparatus of claim 1, wherein said electrical connection layer further includes a plurality of ground vias connected to said first ground layer.

15. The apparatus of claim 14, wherein said ground vias are electrically coupled to said second ground layer.

16. The apparatus of claim 1, further comprising a circuit board connector electrically coupling said first circuit board with said electrical connection layer.

17. The apparatus of claim 1, wherein said electrical connection layer comprises a multi-layer flex circuit.

* * * * *